(12) United States Patent
Lai et al.

(10) Patent No.: US 6,187,486 B1
(45) Date of Patent: Feb. 13, 2001

(54) METHOD OF MULTI-EXPOSURE FOR IMPROVING PHOTOLITHOGRAPHY RESOLUTION

(75) Inventors: Jun-Cheng Lai, Hsinchu; Yeur-Luen Tu, Taichung; Chine-Gie Lou, Hsinchu Hsien, all of (TW)

(73) Assignee: Worldwide Semiconductor Manufacturing Corp., Hsinchu (TW)

( * ) Notice: Under 35 U.S.C. 154(b), the term of this patent shall be extended for 0 days.

(21) Appl. No.: 09/250,766

(22) Filed: Feb. 16, 1999

(30) Foreign Application Priority Data

Jan. 5, 1999 (TW) .................................................. 88100055

(51) Int. Cl.$^7$ ....................................................... G03F 9/00
(52) U.S. Cl. .............................. 430/22; 430/312; 430/394
(58) Field of Search ............................... 430/22, 312, 394

(56) References Cited

U.S. PATENT DOCUMENTS 5,830,610 * 11/1998 Leroux et al. ......................... 430/22

* cited by examiner

*Primary Examiner*—Christopher G. Young
(74) *Attorney, Agent, or Firm*—Jiawei Huang; J C Patents

(57) ABSTRACT

A multi-exposure process. By performing the multi-exposure process, the size of the line width can be enlarged or shrunk by the precondition of the fixed pitch. Moreover, the line width can be shrunk to a level even smaller than the resolving power of the stepper or the scanner. Additionally, by using the invention, the exposure energy, the exposure time and the exposure DOF can be fixed while the exposure process is performed. Therefore, the process window is increased and the yield is enhanced. Furthermore, the processing sequence according to the invention is simpler than the conventional photolithography processing sequence, so that the throughput can be increased.

6 Claims, 2 Drawing Sheets

METHOD OF MULTI-EXPOSURE FOR IMPROVING PHOTOLITHOGRAPHY RESOLUTION

CROSS-REFERENCE TO RELATED APPLICATION

This application claims the priority benefit of Taiwan application serial no. 88100055, filed Jan. 5, 1999, the full disclosure of which is incorporated herein by reference.

BACKGROUND OF THE INVENTION

1. Field of the Invention

The present invention relates to a method of manufacturing a semiconductor device. More particularly, the present invention relates to a multi-exposure process.

2. Description of the Related Art

Typically, the semiconductor process comprises four modules including the diffusion module, the etching module, the thin film module and the photo module. The photo module, in which the photolithography process is performed, is used to replicate the etching patterns for the etching module or implanting patterns for the thin film module on the photomask onto the wafer. Hence, the quality of the semiconductor device depends on whether the resolution of the photolithography process is good.

Additionally, as the size of the device becomes smaller, the tolerance of the design rule becomes smaller and it gradually approaches to the error produced by the process machine, which is called the resolution of the machine. In other words, it is getting more and more difficult to fabricate a device with a tolerance that satisfies the requirement of the design in the deep sub-micron process. Ideally, the misalignment does not occur when the pattern is replicated from the photomask onto the wafer by photolithography in the formation process of a contact or a plug. Therefore, the contact hole or the via hole lands on the location predetermined for forming the contact or the plug. However, it is difficult to align the photomask with the wafer in deep sub-micron process.

Besides the method of buying expensive machines with high resolution, the size of the pattern, such as line width, can be adjusted to increase the alignment allowance to overcome the misalignment problem. In this method, not only the cost is reduced, but also the process window becomes larger and the yield is increased.

In conventional photolithography process, the pitch of the mask is fixed, wherein the pitch is a distance composed of a line width and a space. Since the pitch of the mask is fixed, the pitch of the pattern replicated from the photomask onto the wafer is fixed. However, the exposure energy, the exposure time and the exposure depth of focus (DOF) affects the size of the line width and the space of the pattern replicated from the photomask onto the wafer.

When using the positive photoresist, the exposure region is reduces as the exposure energy or the exposure time is decreased. At the same time, the line width is increased and the space is decreased. Conversely, the line width is decreased and the space is increased when the exposure energy or the exposure time is increased. Nevertheless, the conditions of incomplete development, known as scumming, and the incomplete pattern easily occur, because the line width and the space are adjusted by changing the exposure energy or the exposure time. Hence, the resolution of the pattern replicated from the photomask onto the wafer is poor and the yield is low.

Moreover, another method for adjusting the line width and the space using the precondition of the fixed pitch comprises the steps of forming a hard mask layer to cover a target layer that is going to be patterned. Then, the hard mask layer is patterned by replicating the pattern of the photomask onto the hard mask layer. A conformal layer is formed on the patterned hard mask layer. Thereafter, an etching back process is performed to form a spacer on the sidewall of the hard mask layer. Next, the target layer is patterned by using the hard mask and the spacer as an etching mask. However, the processing sequence of this method is rather complicated and the throughput is low. Usually, the negative etching bias also can be used to shrink line width at a fixed pitch. However, the amount of the shrinkage is not significant enough.

SUMMARY OF THE INVENTION

The invention provides a multi-exposure process to improve the resolution of the replicating pattern and enhance the yield. By using the invention, the processing sequence is simplified and the throughput is increased.

To achieve these and other advantages and in accordance with the purpose of the invention, as embodied and broadly described herein, the invention provides a multi-exposure process. A wafer having a photoresist formed thereon is provided. A photomask aligned with the wafer is provided. A first exposure process is performed to simultaneously form a first exposure region and an unexposed region in the photoresist. A first relative and parallel shift movement is performed to make a relative and parallel shift with a first distance between the wafer and the photomask, wherein the first relative and parallel shift movement has a first direction and a first relative shift distance. A second exposure process is performed to convert a portion of the unexposed region adjacent to the first exposure region into a second exposure region in the photoresist. A second relative and parallel shift movement is performed to make a relative and parallel shift with a second distance between the wafer and the photomask, wherein the second relative and parallel shift movement has a second direction and a second relative shift distance. A third exposure process is performed to convert a portion of the remaining unexposed region adjacent to the first exposure region into a third exposure region in the photoresist. By performing the multi-exposure process, the size of the line width can be enlarged or shrunk at the precondition of the fixed pitch. Moreover, the process window is increased and the yield is enhanced. Furthermore, the throughput can be increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
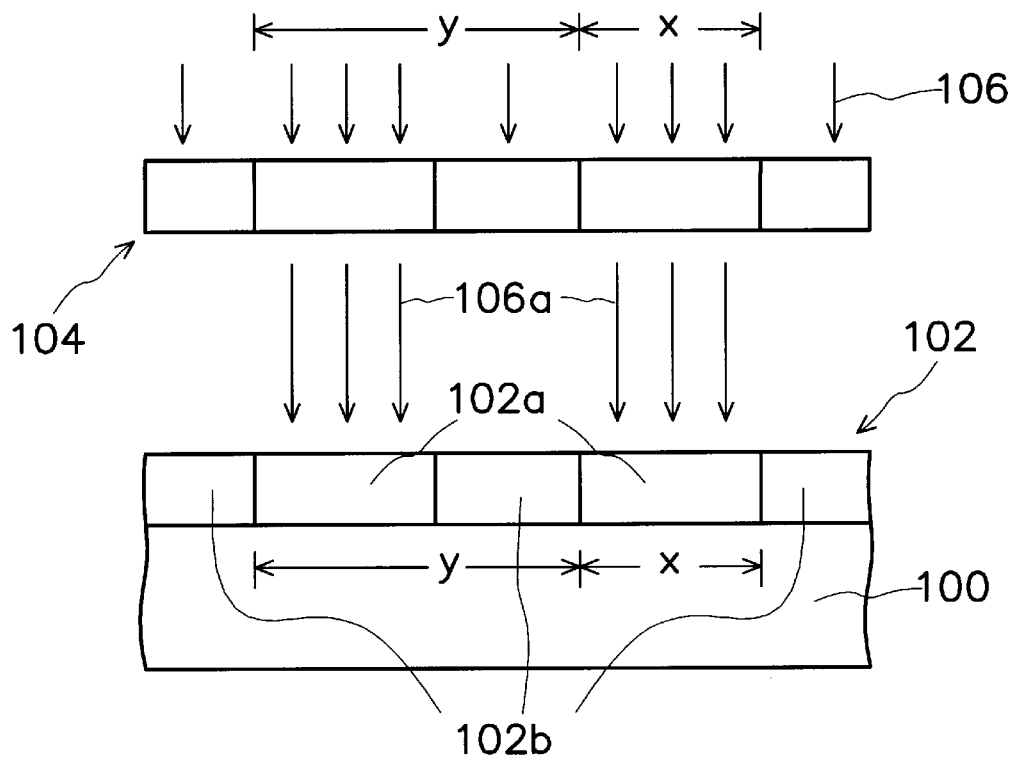
FIGS. 1A through 1C is a schematic, cross-sectional view of a multi-exposure process in a preferred embodiment according to the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
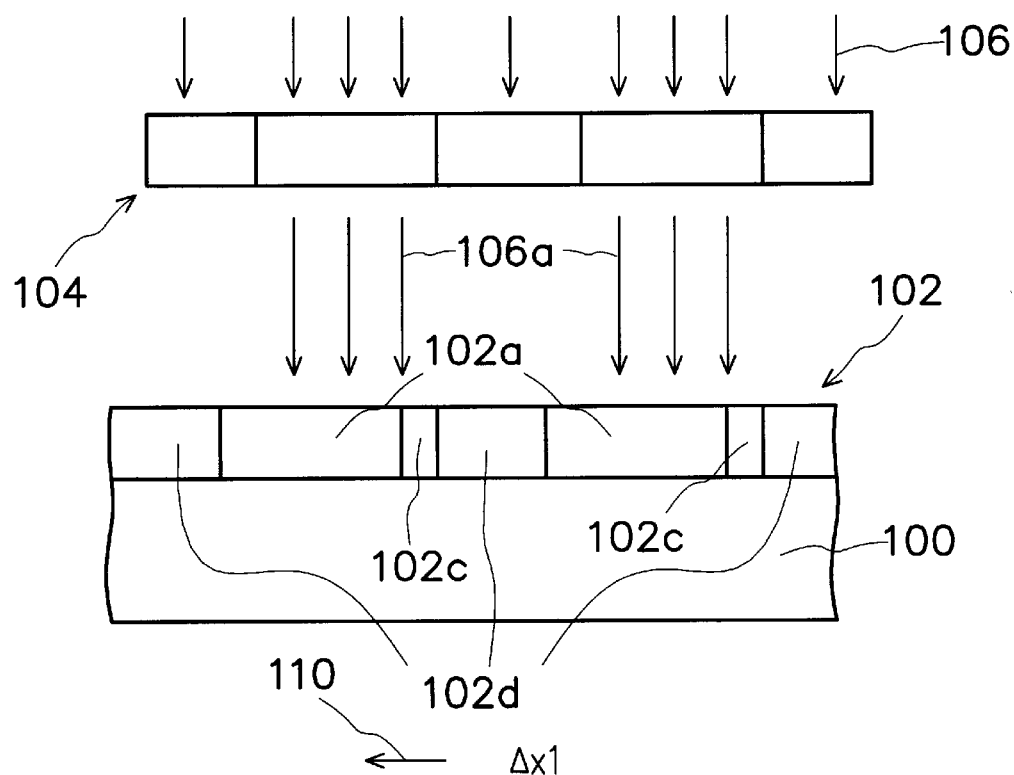
Figure 1C:
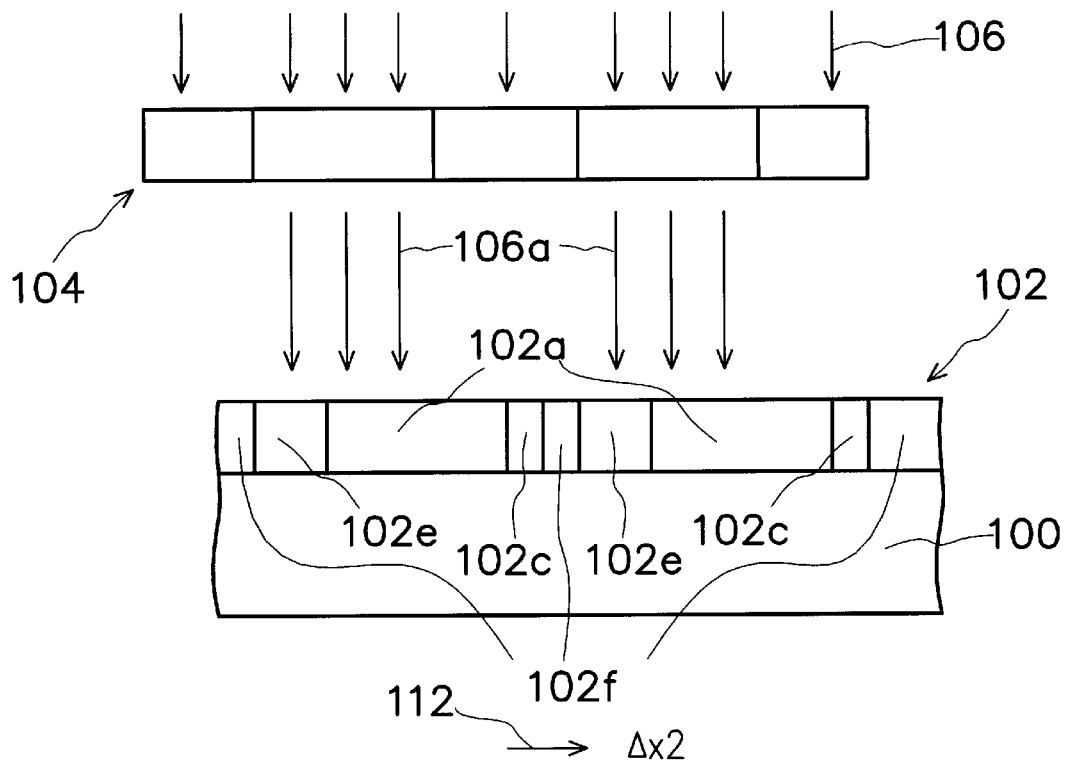
Figure 2:
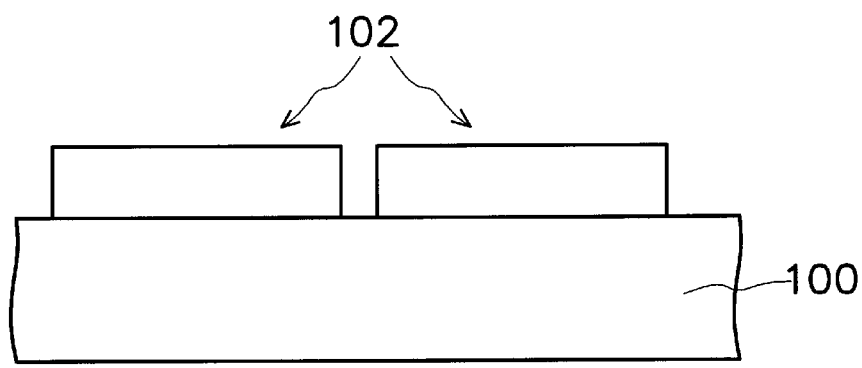
FIG. 2 is a schematic, cross-sectional view of a wafer after a multi-exposure process is performed with a negative photoresist.
Figure 3:
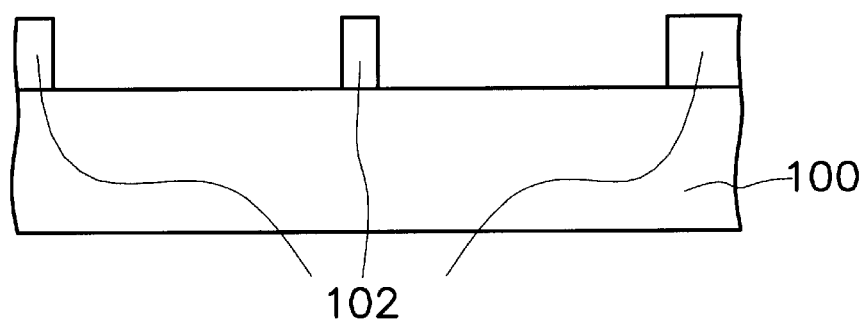
FIG. 3 is a schematic, cross-sectional view of a wafer after a multi-exposure process is performed with a positive photoresist.

FIGS. 1A through 1C is a schematic, cross-sectional view of a multi-exposure process in a preferred embodiment according to the invention. FIG. 2 is a schematic, cross-sectional view of a wafer after a multi-exposure process is performed with a negative photoresist. FIG. 3 is a schematic, cross-sectional view of a wafer after a multi-exposure process is performed with a positive photoresist.

As shown in FIG. 1A, a wafer 100 having a photoresist 102 formed thereon is provided. The photoresist 102 can be a negative photoresist and the material of the photoresist 102 can be polyimide, for example. The method of forming the photoresist 102 includes spin coating. A photomask 104 is almost parallel to the wafer 100 and disposed over the wafer 100 at a proper distance. The photomask 104 has a pattern that is replicated into the photoresist 102, wherein the line width and the pitch of the pattern are respectively denoted as x and y. An exposure process is performed by a light 106 to replicate the pattern from the photomask 104 into the photoresist 102. A portion of the light 106 passing through the photomask 104, which is not covered by the pattern, is denoted as a light 106a. A portion of the photoresist 102 exposed by the light 106a is denoted as an exposure region 102a and the remaining photoresist 102 is denoted as an unexposed region 102b. The light 106 can be a deep ultraviolet ray (DUV ray).

When the exposure energy, the exposure time and the exposure DOF are optimized and the other factors which can affect the process are ignored, the line width and the pitch of the pattern of the photoresist 102 replicated from the photomask 104 are also x and y, respectively.

As shown in FIG. 1B, a relative and parallel shift movement is performed. After the relative and parallel shift with a distance Δx1 between the wafer 100 and the photomask 104 is made, a portion of the unexposed region 102b (as shown in FIG. 1A) adjacent to the exposure region 102a is exposed by the photomask. An exposure process is performed and the portion of the unexposed region 102b adjacent to the exposure region 102a is exposed by the light 106a and is denoted by an exposure region 102c. The remaining unexposed photoresist 102b is denoted by an unexposed region 102d. Additionally, the exposure region 102c is adjacent to the exposure region 102a and the size of the exposure region 102c is similar to the relative shift distance Δx1 between the wafer 100 and the photomask 104. Because of the relative shift distance Δx1, the unexposed region 102b is transformed into an unexposed region 102d and the unexposed region 102b is larger than the unexposed region 102d. The difference between the unexposed region 102b and the unexposed region 102d is similar to the relative shift distance Δx1 between the wafer 100 and the photomask 104. In the other word, after the shift movement is performed, the total exposure region, which is composed of the exposure regions 102a and 102c, is larger than the exposure region 102a. In this example, the method used to form a relative shift distance Δx1 between the wafer 100 and the photomask 104 comprises the step of shifting the wafer 100 in a direction which is parallel to the photomask 104 and is denoted by an arrow 110 while the photomask 104 is stationary.

As shown in FIG. 1C, after the exposure region 102c is formed, the relative positioning between the photomask 104 and the wafer 100 is shifted back to the situation as shown in FIG. 1A. Another relative and parallel shift movement is performed. The shift direction is denoted by an arrow 112 and the direction is opposite to the arrow 110 as shown in FIG. 1B. After the relative and parallel shift with a distance Δx2 between the wafer 100 and the photomask 104 is made, a portion of the unexposed region 102d (as shown in FIG. 1B) adjacent to the exposure region 102a is exposed by the photomask. An exposure process is performed and the portion of the unexposed region 102d adjacent to the exposure region 102a is exposed by the light 106a and is denoted as an exposure region 102e. The remaining unexposed photoresist 102d is denoted by an unexposed region 102f. Moreover, the exposure region 102e is adjacent to the exposure region 102a and the size of the exposure region 102e is similar to the relative shift distance Δx2 between the wafer 100 and the photomask 104. Because of the relative shift distance Δx2, the unexposed region 102d is transformed into an unexposed region 102f and the unexposed region 102d is larger than the unexposed region 102f. In the other word, after the shift movement is performed, the total exposure region, which is composed of the exposure regions 102a, 102c and 102e, is larger than the exposure regions 102a and 102c. The difference between the unexposed region 102d and the unexposed region 102f is similar to the relative shift distance Δx2 between the wafer 100 and the photomask 104. In this example, the method used to form a relative shift distance Δx2 between the wafer 100 and the photomask 104 comprises the step of shifting the wafer 100 in a direction which is parallel to the photomask 104 and is denoted by an arrow 112 while the photomask 104 is stationary.

As shown in FIG. 2, a development process is performed to remove a portion of the photoresist 102 and finish the photolithography process. When the photoresist 102 is a negative photoresist, the portion of the photoresist 102 in the exposure regions 102a, 102c and 102e are polymerized to form a structure which can resist the developer after exposure. Since the unexposed region 102f is not polymerized, it cannot resist the developer. Hence, the unexposed region 102f is removed by the developer while the development process is performed and the exposure regions 102a, 102c and 102e are left on the wafer 100. After the development process, the line width and the space of the pattern of the photoresist 102 are substantially the sum of x, Δx1 and Δx2 and the sum of y, −x, −Δx1 and −Δx2, respectively. Furthermore, the pitch of the pattern of the photoresist, that is the sum of the line width and the space, is y. Hence, the size of the line width can be enlarged by the precondition of the fixed pitch while the photoresist 102 is a negative photoresist.

As shown in FIG. 3, when the photoresist 102 is a positive photoresist, the portion of the photoresist 102 in the exposure regions 102a, 102c and 102e are photosolubilized by the light 106a and converted into a more soluble state which cannot resist the developer after exposure. Because the unexposed region 102f is not photosolubilized by the light 106a, it can resist the developer. Hence, the exposure regions 102a, 102c and 102e are removed by the developer while the development process is performed and the unexposed region 102f is left on the wafer 100. Because of the positive photoresist, the line width of the pattern transferred from the photomask 104 (as shown in FIG. 1A) is y-x, and the pitch of the pattern still is y. After the development process, the line width and the space of the pattern of the photoresist 102 are substantially the sum of y, -x, -Δx1 and -Δx2 and the sum of x, Δx1 and Δx2, respectively. Furthermore, the pitch of the pattern of the photoresist, that is the sum of the line width and the space, still is y. Hence, the size of the line width can be shrunk by the precondition of the fixed pitch while the photoresist 102 is a positive photoresist.

In the preferred embodiment, the multi-exposure process according to the invention is denoted by a three-step exposure process. In application, the multi-exposure process can include just only two exposure steps or more than two exposure steps.

In the invention, by performing the multi-exposure process, the size of the line width can be enlarged or shrunk by the precondition of the fixed pitch. Moreover, the line width can be shrunk to a level even smaller than the resolving power of the stepper or the scanner. Additionally, by using the invention, the exposure energy, the exposure time and the exposure DOF can be fixed while the exposure process is performed. Therefore, the process window is increased and the yield is enhanced. Furthermore, the processing sequence according to the invention is simpler than the conventional photolithography processing sequence, so that the throughput can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of multi-exposure for improving photolithography resolution that comprises the step of:

providing a wafer having a photoresist formed thereon;

providing a photomask aligned above with the wafer;

performing a first exposure to simultaneously form a first exposed region and an unexposed region in the photoresist;

performing a first shift of the wafer parallel to the photomask resulting in a first relative and parallel shift movement, wherein the first relative and parallel shift movement has a first direction and a first relative shift distance;

performing a second exposure to convert a portion of the unexposed region adjacent to the first exposed region into a second exposed region in the photoresist;

performing a second shift of the wafer parallel to the photomask resulting in a second relative and parallel shift movement, wherein the second relative and parallel shift movement has a second direction and a second relative shift distance;

performing a third exposure to convert a portion of the remaining unexposed region adjacent to the first exposure into a third exposed region in the photoresist; and performing a development of the photoresist.

2. The method of multi-exposure for improving photolithography resolution as claimed in claim 1, aimed to enlarging a line width of a photomask pattern, wherein the photoresist is a negative photoresist.

3. The method of multi-exposure for improving photolithography resolution as claimed in claim 1, aimed to shrinking a line width of a photomask pattern, wherein the photoresist is a positive photoresist.

4. The method of multi-exposure for improving photolithography resolution as claimed in claim 1, wherein the first and second relative and parallel shift movement are performed while the photomask is stationary.

5. The method of multi-exposure for improving photolithography resolution as claimed in claim 1, wherein the second direction of the shift is opposite to the first one.

6. The method of multi-exposure for improving photolithography resolution as claimed in claim 1, wherein the first relative shift distance is smaller than the second relative shift distance.

* * * * *